(12) United States Patent
Hesse et al.

(10) Patent No.: US 8,530,924 B2
(45) Date of Patent: Sep. 10, 2013

(54) ORGANIC PHOTOELECTRIC DEVICE

(75) Inventors: Jan Hesse, Dresden (DE); Joerg Amelung, Dresden (DE); Christian Kirchhof, Dresden (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 188 days.

(21) Appl. No.: 12/947,621

(22) Filed: Nov. 16, 2010

(65) Prior Publication Data

US 2011/0121352 A1    May 26, 2011

(30) Foreign Application Priority Data

Nov. 17, 2009  (DE) .......................... 10 2009 046 755

(51) Int. Cl.
*H01L 51/50*        (2006.01)
(52) U.S. Cl.
USPC ............. 257/99; 257/100; 257/103; 257/433; 257/E51.018
(58) Field of Classification Search
USPC ..................................... 257/99, E51.018, 433
See application file for complete search history.

(56) References Cited

U.S. PATENT DOCUMENTS

| 2002/0130615 A1 | 9/2002 | Saito et al. |
| 2005/0127818 A1 | 6/2005 | Ohtani |
| 2007/0270072 A1 | 11/2007 | Kim et al. |

FOREIGN PATENT DOCUMENTS

| JP | 2000-215982 | 8/2000 |
| JP | 2000-515309 | 11/2000 |
| JP | 2001-052858 | 2/2001 |
| JP | 2001-223079 | 8/2001 |
| JP | 2002-008856 | 1/2002 |
| JP | 2005-078906 | 3/2005 |
| JP | 2005-506666 | 3/2005 |
| JP | 2005/173579 | 6/2005 |
| JP | 2008-166181 | 7/2008 |
| JP | 2008-300101 A | 12/2008 |
| JP | 2009-503777 | 1/2009 |
| WO | WO 03/034513 A1 | 4/2003 |
| WO | WO 2007/013001 A2 | 2/2007 |

*Primary Examiner* — Mamadou Diallo
(74) *Attorney, Agent, or Firm* — Michael A. Glenn; Perkins Coie LLP

(57) ABSTRACT

An organic photoelectric device includes a substrate, a base electrode, an electrode terminal, a roof electrode, an organic functional layer, and a self-supporting cover member. The base electrode is configured above a first surface of the substrate, and the electrode terminal is accessible from above the first surface of the substrate. The self-supporting cover member serves to encapsulate the organic functional layer, which is arranged between the substrate and the self-supporting cover member, the self-supporting cover member being formed from conductive material or being coated with a conductive material on a side facing the substrate. The conductive material is locally coupled, in an electrically conductive manner, to the base electrode or the roof electrode at laterally distributed locations, and is further coupled to the electrode terminal in an electrically conductive manner.

15 Claims, 12 Drawing Sheets

ORGANIC PHOTOELECTRIC DEVICE

CROSS-REFERENCE TO RELATED APPLICATIONS

This application claims priority from German Patent Application No. 102009046755.6, which was filed on Nov. 17, 2009, and is incorporated herein in its entirety by reference.

The present invention relates to an organic photoelectric device such as an organic light emitting diode or an organic photocell, for example.

BACKGROUND OF THE INVENTION

On the basis of organic light emitting diodes (OLEDs), novel area light elements can be realized. As two-dimensional illuminants whose luminance is moderate as compared to that of LEDs, OLEDs are ideally suited for manufacturing two-dimensional diffuse light sources. Said light sources are predicted to see a tumultuous development similar to that of displays based on OLEDs. Due to their thin-layer technology, OLEDs may also enable, in the distant future, realizing flexible illuminants that allow entirely new applications in terms of illumination of spaces, or rooms.

Since OLEDs are current-operated devices, an important issue in the manufacture of large-area light emission elements is homogeneous current density distribution on large areas. Said homogeneity is limited by the necessity of at least one transparent contact, which is normally realized by transparent conductive oxides (TCOs) or transparent metal layers. Due to the low conductivity of said TCOs, said layers limit the maximum light emitting surface area.

Solar cells based on organic materials (OPVCs) are comparable, in terms of architecture, to OLEDs; however, due to the organic materials used, said structures enable optical radiation to be converted to electrical current. Said current may be drained off via the contacts. In this case, too, the transparent electrical contact reduces the maximally usable device size.

A known architecture of an OLED or OPVC comprises, in addition to a substrate having a transparent electrode base layer of ITO, ZnO, for example, substrate metallization, insulating layers, the stack of the organic functional layers (HTL, insulation, emitter, ETL) as well as a metallic roof electrode. A cover glass that is provided with cavities on the inside is adhered to the substrate by means of an encapsulation adhesive and seals the functional layers toward the outside.

Both with organic light emitting diode areas (OLEDs) and with organic solar cells (OPVCs), a high filling level (ratio between active surface area and overall surface area) is a very important criterion for usability. With OLEDs and/or OPVCs, said filling level is limited by two factors.

The first factor is encapsulation. Encapsulation is typically effected at least by means of a thin-layer encapsulation protecting the layer construction from air and air humidity. What is most widely employed and useful for utilization as a light source in marketable products is a mechanical protection of the organic layers that can be realized only via encapsulation by means of a cover glass. Said cover glass is adhered to the substrate in the non-active edge region of the OLEDs or OPVCs, typically by means of a UV-curable adhesive. Said adhesive region, which cannot be minimized to any extent desired in order to ensure a barrier effect toward air and to ensure mechanical stability, is not available for the active light emitting area.

The second factor is the useful electric contacting of the OLED and/or OPVC, which is also effected in the edge region, but outside the cover glass. Contact pads are typically deposited within said region, metal conductor lines leading from said contact pads to the electrodes underneath the cover glass.

Those two factors, adhesive area and contact pads, lead to a reduction in the active area of the OLED and/or OPVC and to a significant non-luminous edge with OLEDs, and to a non-light-absorbing edge with OPVCs.

In addition to a comparatively low filling level, this results in that, when several OLED elements are lined up in order to achieve a large light emitting area, there will be a clearly visible non-luminous grid.

A standard design of an OLED and of a solar cell, or OPZV, comprises a transparent ITO layer (indium tin oxide) as a top electrode on glass having a thickness of about 100 nm, an organic layer (sometimes comprising up to 7 sub-sheets) having a thickness of about 100-200 nm, and a metallic cathode (in most cases made of aluminum) having a thickness of about 100-500 nm; the respective layer thicknesses are limited and cannot be increased to any amount desired so as to achieve, for example, a lower sheet resistance of the electrode layers. One variant of this design in case of utilizing non-transparent substrates is to use a transparent top electrode (thin metal or ITO) to achieve light being coupled out and/or in via the top electrode.

With large-area devices, the high resistance of the transparent layer (about 10-100 ohm/square), i.e. of the ITO layer, or top electrode, leads to inhomogeneity of the power input, since the contacts of the layer are possible only on the edge of the light emission element. Thus, the maximum size is limited to about 50×50 mm$^2$.

To achieve larger light emitting areas, in particular metal reinforcements in the form of webs are introduced into the transparent layer. Said metal meshes (also referred to as busbars or grids) reduce the effective sheet resistance in accordance with their packing density, and thus enable realization of larger light emitting areas.

Due to their non-transparency, said grids, or webs, reduce the effective surface area of the device. For this reason, metal grids, or metal meshes, of up to about 25% of the ITO surface area are actually useful. A useful improvement would be to increase the grid metal thickness, or the thickness of the lines of the metal mesh, which is not useful, however, due to the structuring possibilities and layer thicknesses of the organic layers.

The external contacts of the OLED/OPVC elements are connected to a distribution board via spring contacts or similar electric contacts. Since it is via these contacts that the total current for the anode and the cathode is supplied or drained off, the contact may be divided into at least two. In order to achieve homogeneous light distribution with this configuration, a lateral wide contacting line is useful, which reduces the active light emitting area, or the optically active area.

One alternative to edge contacting is rear-side contacting, wherein in the event of an OLED emitting through the substrate, an insulating layer is applied over the roof electrode, and a further metal layer is applied on said insulating layer, said metal layer being connected to the transparent electrode underlying the organic layers via a through-connection.

However, since the cover glass is still useful, even in this case, an inactive region for adhering the cover glass to the substrate is useful. In addition, a contacting area is also useful on at least one side of the OLED, which increases the non-luminous edge region on said side.

A further problem are the cover glasses for encapsulating the OLED/OPVC elements, which may have cavities in order to receive the functional layers and absorption materials. Said cavities can be produced only by means of production processes (generally by etching) requiring a large amount of resources, which is reflected in a high unit price, in particular with large-area OLED/OPVC elements. In addition, the production process has a high potential of damaging the environment due to the etching chemicals used.

SUMMARY

According to one embodiment, an organic photoelectric device may have: a substrate; a base electrode formed on a first surface of the substrate; a first electrode terminal accessible from above the first surface of the substrate; a roof electrode; an organic functional layer arranged between the base electrode and the roof electrode; a self-supporting cover member for encapsulating the organic functional layer (50) between the substrate and the self-supporting cover member, the self-supporting cover member being formed of a conductive material or being coated with a conductive material on a side facing the substrate; the conductive material being locally coupled, in a conductive manner, to the base electrode or to the roof electrode at laterally distributed locations; and the conductive material being coupled to the first electrode terminal in an electrically conductive manner.

The core idea of the present invention is that with an organic photoelectric device comprising a substrate, a base electrode, a roof electrode, an organic functional layer and a self-supporting cover member, an improved area utilization ratio may be achieved when the self-supporting cover member is formed from or coated with a conductive material. The conductive material of the self-supporting cover member may be locally coupled, for example, at laterally differing locations, to the base electrode or the roof electrode in a conductive manner, and is conductively coupled to the electrode terminal. A coating of the self-supporting cover member with conductive material may be implemented, for example, on a side of the self-supporting cover member which faces the substrate. Since the cover member may be configured to be sufficiently stable, the lateral conducting properties of the conductive material and, thus, the lateral distribution of the current injection into the roof electrode or the base electrode are almost unlimited. Advantageously, the organic photoelectric device is implemented as a substrate emitter, or substrate absorber, and/or the substrate is just as transparent to useful wavelengths of the organic photoelectric device as is the base electrode. The self-supporting cover member may further serve to encapsulate the organic functional layer, for example.

One advantage of the present invention is that, by using an electrically conductive cover member, or a cover member having an electrically conductive coating, reduction of the inactive edge regions of an organic photoelectric device is enabled, which therefore leads to a larger optically active area of the organic photoelectric device.

In particular, due to utilization of an electrically conductive cover member, or a cover member having an electrically conductive coating, in embodiments of the invention, the metal meshes described in conventional technology for reducing the sheet resistance may be dispensed with, as a result of which the optically active area of the organic photoelectric device is increased further, and/or the manufacturing expenditure is reduced, and/or the light emission capability increases.

In addition, the conductive coating of the self-supporting cover member, or the conductive self-supporting cover member, which are both easy to produce, enables input of the power into the electrically conductive coating or cover member at only one terminal, from the outside, on a housing of the organic photoelectric device, which results in further improvement of the area utilization ratio.

Embodiments of organic photoelectric devices may be configured, for example, as an OLED (organic light emitting diode), an OLED structure, or as an OPVC (organic photovoltaic cell/organic solar cell).

An organic light emitting diode will also be referred to as OLED for short in the following. An organic photovoltaic cell will also be referred to in the following as an organic solar cell, or as OPVC for short. An organic photoelectric device will also be referred to in the following as OLED/OPVC for short.

A self-supporting cover member will in the following sometimes also be referred to as an encapsulation element.

Embodiments of the present invention thus enable producing large-format OLED light emission elements and organic solar cells (OPVCs), improved impression in the event of lining up several OLED elements due to smaller and, thus, less visible inactive regions between the individual elements, and a larger optically active area in the event of lining up several OPVC elements.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
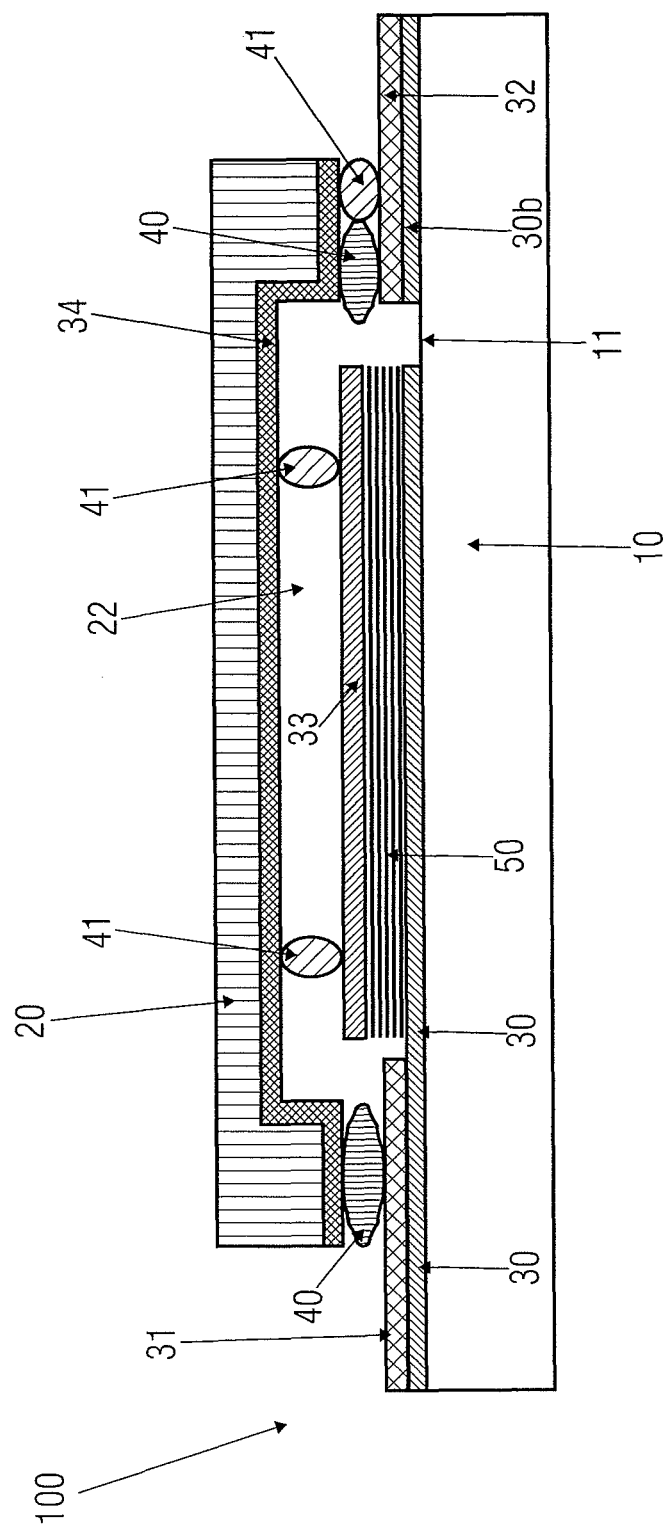
FIG. 1 shows a sectional view of an organic photoelectric device in accordance with a first embodiment of the present invention.

Before the present invention is explained in more detail below with reference to the figures, it shall be noted that identical elements in the figures are provided with identical or similar reference numerals and that repeated description of said elements will be dispensed with.

FIG. 1 shows a sectional view of an organic photoelectric device in accordance with a first embodiment of the present invention. The organic photoelectric device 100 comprises a substrate 10, which includes a surface 11. The surface 11 has a base electrode 30a as well as an electrically insulated partial base electrode 30b formed thereon. Following this, a roof electrode 33 is formed, so that an organic functional layer 50 is arranged between the roof electrode 33 and the base electrode 30. The lateral extension of the organic functional layer 50 is the same, for example, as the lateral extension of the roof electrode, or deviates only slightly therefrom. The base electrode 30a has a substrate metallization 31 on one of its edges on a surface facing away from the surface 11. On a surface facing away from the surface 11, the partial base electrode 30b has a substrate metallization 32, which corresponds, for example, to the partial base electrode 30b in terms of lateral dimensions, or deviates only slightly from same. An encapsulation adhesive 40 and an electrically conductive adhesive 41, which is bordered on by an electrically conductive coating 34 of a self-supporting cover member 20, are arranged on a surface of the substrate metallization 32 that does not face the partial base electrode 30b. A surface of the substrate metallization 31 that does not face the base electrode 30 has a further encapsulation adhesive 40 arranged thereon, which is bordered on by the electrically conductive coating 34 of the self-supporting cover member 20. The self-supporting cover member 20 comprises a cavity 22 wherein the layer stack consisting of a part of the base electrode 30, the organic functional layer 50, and the roof electrode 33 is arranged. The substrate metallizations 31 and 32 as well as the base electrode 30 and partial base electrode 30b bordering on the substrate metallizations 31 and 32 laterally project above the region encapsulated by the self-supporting cover member 20 so as to enable contacting of the substrate metallization 31, which may be configured as an anode terminal 31, and of the substrate metallization 32, which may be configured as a cathode terminal 32. Within the cavity 22, the electrically conductive coating 34 is connected, for example, to the roof electrode 33 in an electrically conductive manner in several places by means of an electrically conductive adhesive 41.

The self-supporting cover member 20 may be configured as a cover glass 20, for example; it is not absolutely necessary to use glass as the material for the cover glass 22, but it would also be possible to use a transparent plastic, for example, for realizing flexible apparatuses, for example. The cavity 22 of the cover glass 20 may be etched, embossed, or milled into a planar glass, for example by means of a subtractive process. The electrically conductive coating 34 of the cover glass 20 may be configured as a cover glass metallization 34, for example.

A cover glass may also be referred to in the following as an encapsulation glass or enclosure glass.

The metallization of the cover glass 20, or coating of the cover glass 20 with another conductive material has the purpose of carrying the current—which has been introduced onto the cover glass metallization 34, or onto the coating 34 of the cover glass 20, for example via the substrate metallization 32—onto the cover glass 20 by means of an electrically conducting adhesive 41, or to uniformly distribute the current with the aid of the cover glass 20, as the support of the cover glass metallization 34. The cover glass metallization 34 continues to carry the current to further points of contact, which may be positioned at other locations of the edge region of the organic photoelectric device 100, or may be distributed across the entire surface area of the cover glass 20. The distributed points of contact, in turn, carry the current onto the roof electrode 33 by means of electrically conductive adhesive 41. Thus, uniform current distribution across the entire surface area of the roof electrode 33 may be enabled.

In other words, the cover glass metallization 34 is connected, by means of an electrically conductive adhesive 41, to the cathode terminal 32, or to the substrate metallization 32. In this manner, the inactive edge regions are minimized in that the substrate metallization 32 now only has the width useful for encapsulation, and in that the current transport, or the current distribution, by contrast, is effected by means of the cover glass metallization 34 of the cover glass 20.

In other words, the optically inactive edge area of the organic photoelectric device 100 is reduced due to the combination of the encapsulation area and the electrically conductive surface area on the substrate metallization 32.

This is important particularly for large-area OLED/OPVC substrates, since, as the surface area increases, the flow of current and the line cross-section—and, thus, the line width—useful for a loss in current transport increases as well.

In addition, the current is carried to the roof electrode 33 using electrically conductive adhesive 41 within the cavity 22 of the cover glass 20. This solution enables introducing the current only on one side or corner of the organic photoelectric device. The cover glass metallization 34 ensures efficient distribution of the current on the surface area, and/or enables electrical wiring of different active modules on the substrate surface 11.

The cover glass metallization 34 may be applied by pressure processes, for example. Advantageously, the cavity 22 within the cover glass 20 is chamfered for this purpose. Otherwise, the cavity edge may be provided with a paste or a filler material so as to enable metallization of the slope.

It shall be mentioned that the embodiments described herein are configured to emit and/or absorb light through the substrate. The self-supporting cover member 20 thus forms the rear side of the embodiments described here, and the substrate 10 forms the front side of the embodiments described here.

It shall also be mentioned that the lateral extensions of the organic functional layer 50 and of the electrodes surrounding it determine the optically active areas of the organic photoelectric devices.

It shall also be mentioned that the base electrode 30 of the optical device 100 shown in FIG. 1 may comprise a metal mesh for reducing the resistance of the base electrode 30 and to achieve improved current distribution.

Figure 2:
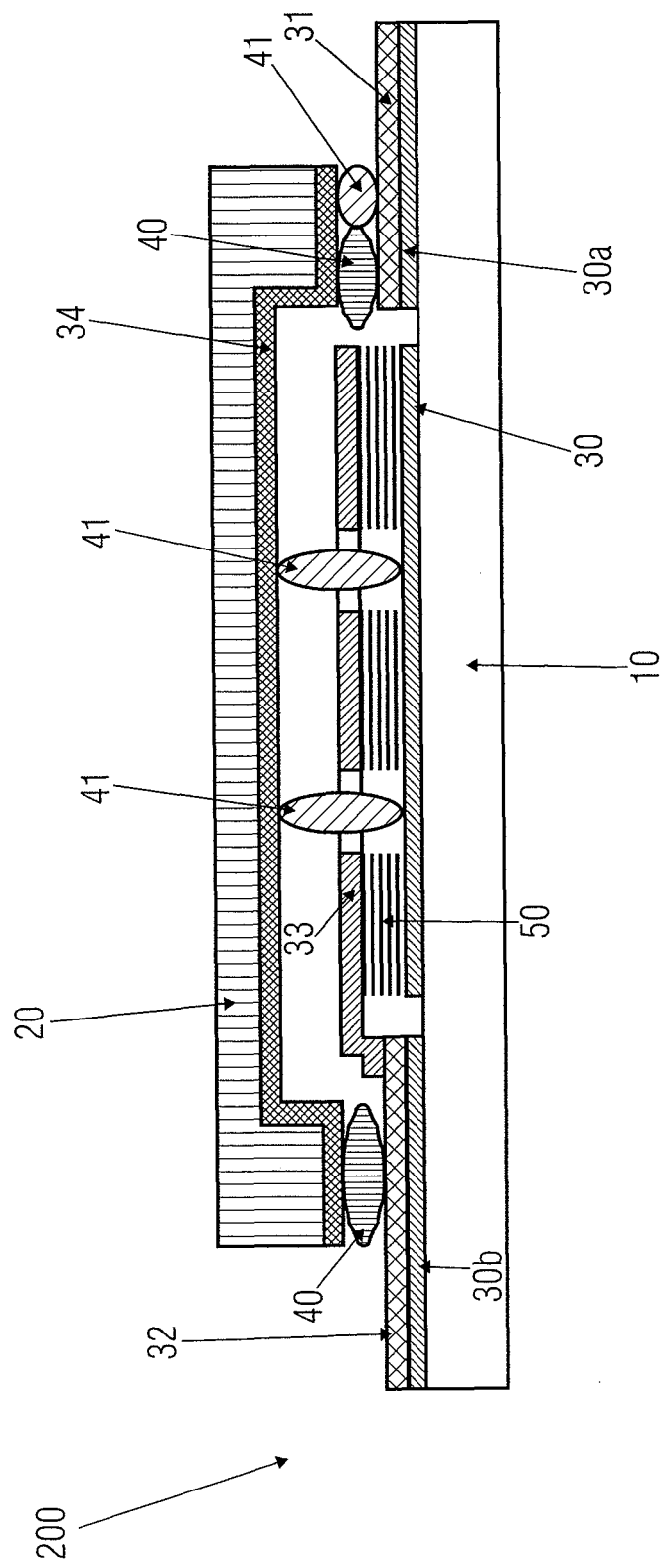
FIG. 2 shows a sectional view of a photoelectric device in accordance with a second embodiment of the present invention.

FIG. 2 shows a sectional view of an organic photoelectric device 200 in accordance with a second embodiment of the present invention. The organic photoelectric device 200 comprises a substrate 10, which includes a surface 11. The surface 11 has a base electrode 30, a first partial base electrode 30a and a second partial base electrode 30b formed thereon. Following this, a roof electrode 33 is formed, so that an organic functional layer 50 is arranged between the roof electrode 33 and the base electrode 30. The lateral extension of the organic functional layer 50 is the same, for example, as the lateral extension of the roof electrode, or deviates only slightly therefrom. On a surface facing away from the surface 11, the first partial base electrode 30a has a substrate metallization 31, which corresponds, for example, to the first partial base electrode 30a in terms of lateral dimensions, or deviates only slightly from same. On a surface facing away from the surface 11, the second partial base electrode 30b has a substrate metallization 32, which corresponds, for example, to the second partial base electrode 30b in terms of lateral dimensions, or deviates only slightly from same. An encapsulation adhesive 40 and an electrically conductive adhesive 41, which is bordered on by an electrically conductive coating 34 of a self-supporting cover member 20, are arranged on a surface of the substrate metallization 31 that does not face the first partial base electrode 30a. A surface of the substrate metallization 32 that does not face the second partial base electrode 30b has a further encapsulation adhesive 40 arranged thereon, which is bordered on by the electrically conductive coating 34 of the self-supporting cover member 20. The self-supporting cover member 20 comprises a cavity 22 wherein the layer stack consisting of the base electrode 30, the organic functional layer 50, and the roof electrode 33 is arranged. The substrate metallizations 31 and 32 as well as the partial base electrodes 30a and 30b bordering on the substrate metallizations 31 and 32 laterally project above the region encapsulated by the self-supporting cover member 20 so as to enable contacting of the substrate metallization 31, which may be configured as an anode terminal 31, and of the substrate metallization 32, which may be configured as a cathode terminal 32. The roof electrode 33 is directly connected to the cathode terminal 32, or to the substrate metallization 32, in an electrically conductive manner, for example via a conductive ridge. The cover glass metallization 34 is connected to the transparent base electrode 30 in an electrically conductive manner. The roof electrode 33 as well as the organic functional layer 50, or the functional stack of the organic photoelectric device, such as of an OLED, for example, comprise electrically insulated through-connections for this purpose. Within said through-connections, electrically conducting adhesive 41 may be arranged for connecting the cover glass metallization 33 to the base electrode 30 in an electrically conductive manner. In other words, the current from the anode terminal 31, or the substrate metallization 31, is carried, by means of an electrically conductive adhesive 41, onto the cover glass metallization 34 of the cover glass 20, which uniformly distributes the current or electrically interconnects different active modules and subsequently leads onto the transparent base electrode 30 via further electrically conductive adhesive 41. Thus, the base electrode 30 and the first partial base electrode 30a have an identical potential.

In further embodiments of the present invention, the electrically conductive adhesive 41 may also be replaced by an electrically conductive contact pin, for example. The through-connections may be arranged, for example as bores, at locally laterally varying places of the roof electrode 33 and of the organic functional layer 50. It is to be noted in this context that the through-connections do not adversely affect an electric conductivity of the roof electrode 33 and a function of the organic functional layer 50.

In other words, the cover glass metallization 34 carries the current to further points of contact, which may be located in other positions of the edge region or be distributed across the entire surface area of the cover glass 20, which, in turn, carry the current onto the base electrode 30 by means of electrically conductive adhesive 41. Thus, uniform current distribution across the entire surface area of the base electrode 30 may be enabled.

One advantage of the optical device 200 shown in FIG. 2 is that, due to the electrically conductive coupling of the conductive material 34 to the base electrode 30 locally at varying locations, a metal mesh within or on the base electrode 30 for reducing the sheet resistance may be dispensed with, as a result of which the optical active surface area is increased and, if the organic photoelectric device 200 is configured as a substrate emitter, the optical impression and the light emission capability are improved.

Figure 3:
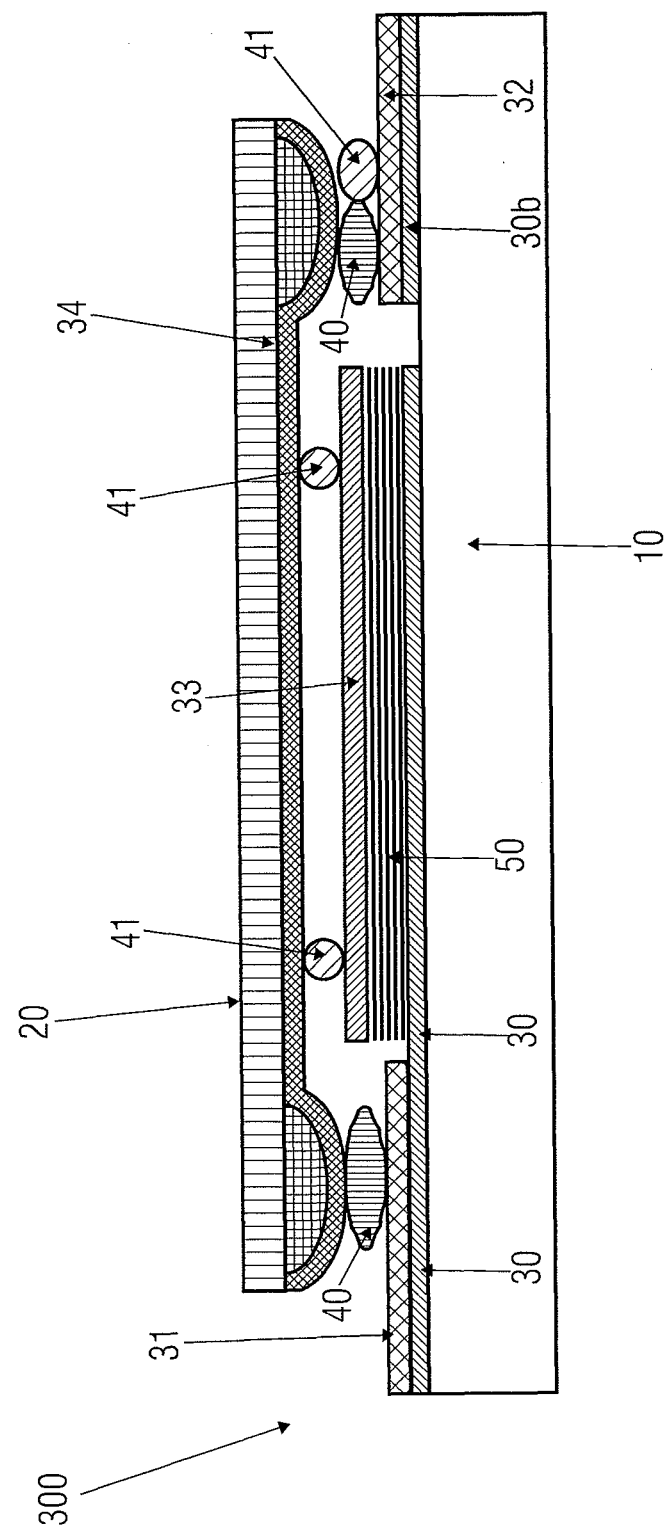
FIG. 3 shows a sectional view of a photoelectric device in accordance with a third embodiment of the present invention.

FIG. 3 shows a sectional view of an organic photoelectric device 300 in accordance with a third embodiment of the present invention. The organic photoelectric device 300 shown in FIG. 3 differs from the organic photoelectric device 100 shown in FIG. 1 in that, instead of a glass provided with cavities 22, a planar no-cavity glass substrate is used as the cover glass 20. Instead of producing the depressions or cavities in a subtractive manner by means of etching, an encapsulation edge is created on the edges of the cover glass 20 by means of a glass frit paste fused in a structured manner, which glass frit paste implements the distance—useful for the active layers and/or the organic functional layer 50 and for the accommodation of getter materials—between the coated substrate 100 and the cover glass substrate, or cover glass 20.

Figure 4:
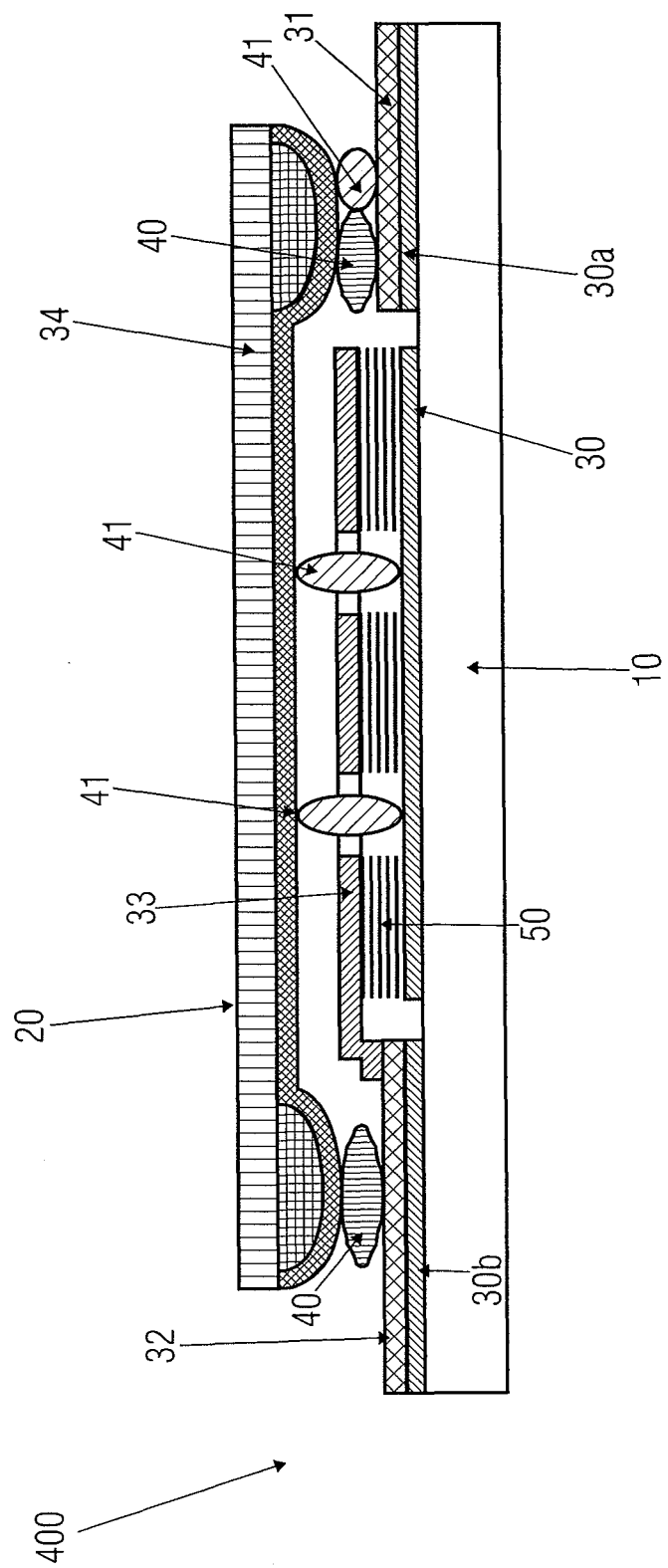
FIG. 4 shows a sectional view of a photoelectric device in accordance with a fourth embodiment of the present invention.

FIG. 4 shows a sectional view of a photoelectric device 400 in accordance with a fourth embodiment of the present invention. The organic photoelectric device 400 shown in FIG. 4 differs from the organic photoelectric device 200 shown in FIG. 2, by analogy with the organic photoelectric devices 300 and 100, by utilization of an additive process on the basis of glass frit paste that has been fused in a structured manner in order to create cavities. The encapsulation edge of the cover glass 20, i.e. the region spared by the cavities, is imprinted, in this case too, for example in the form of a paste made of glass frits, and is subsequently burnt into the clear cover glass at suitable temperatures.

Figure 5:
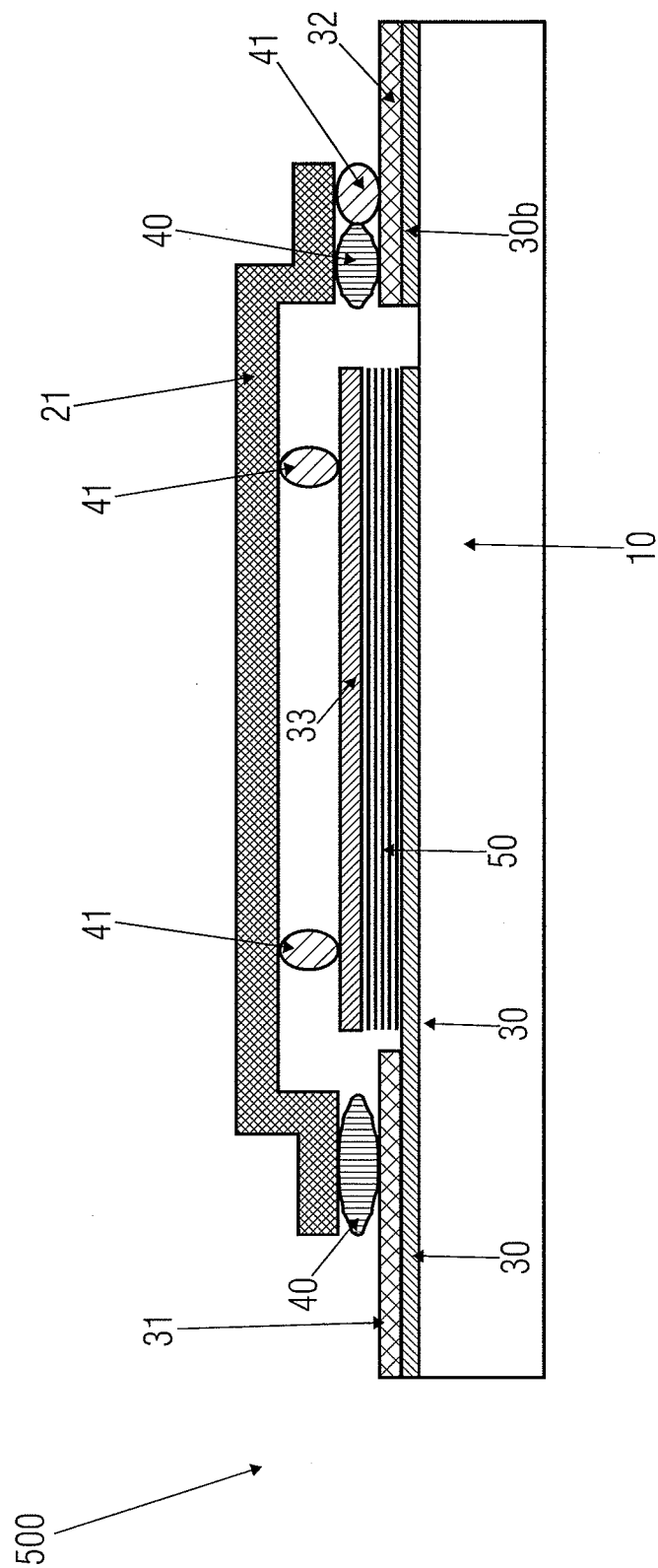
FIG. 5 shows a sectional view of a photoelectric device in accordance with a fifth embodiment of the present invention.

FIG. 5 shows a sectional view of an organic photoelectric device 500 in accordance with a fifth embodiment of the present invention. The organic photoelectric device 500 shown in FIG. 5 differs from the organic photoelectric device 100 shown in FIG. 1 by utilization of a cover plate 21 made of sheet metal, instead of a cover glass, as the self-supporting cover member. Due to utilization of an electrically conductive cover plate 21 instead of an electrically non-conductive cover glass, an electrically conductive coating of the cover member is unnecessary. The electrically conductive cover plate 21 made of sheet metal is connected to the cathode terminal of the substrate metallization 32 by means of an electrically conductive adhesive 41 in addition to the encapsulation adhesive 40. In this manner, the inactive edge regions are minimized in that the substrate metallization 32 now only has the width that is useful for encapsulation, and the current transport, or current distribution, by contrast, is effected by the cover plate 21. It is sufficient for the electrically conductive adhesive 41 to be applied only on the corners, possibly only on one corner, if the cathode terminal pad of the substrate metallization 32 is located there. By means of the electrically conductive adhesive 41, or the conducting adhesive, the current is carried from the substrate metallization 32 onto the cover plate 21, and from the cover plate 21 onto the roof electrode 33. This solution enables introducing the current only on one side or corner of the organic photoelectric device 500; naturally, the current may also be introduced on several corners, or all corners of the organic photoelectric device 500. The electrically conducting cover plate 21 ensures efficient distribution of the current on the surface area, and/or enables electrical wiring of different active modules on the substrate surface.

Utilization of a metallic cover plate 21 is particularly suited for mass production of large-area OLEDs or OPVCs, since the cover plates 21 may be produced, for example by means of deep drawing, in large numbers of pieces, in large sizes and at low cost. In addition, etching of the cover glass cavities 22 for the cover glasses, said etching being costly and harmful to the environment, is dispensed with. In addition, utilization of a metal cover plate 21 offers improved mechanical stability, since the fragile glass substrate is framed by the metal cover 21.

Figure 6:
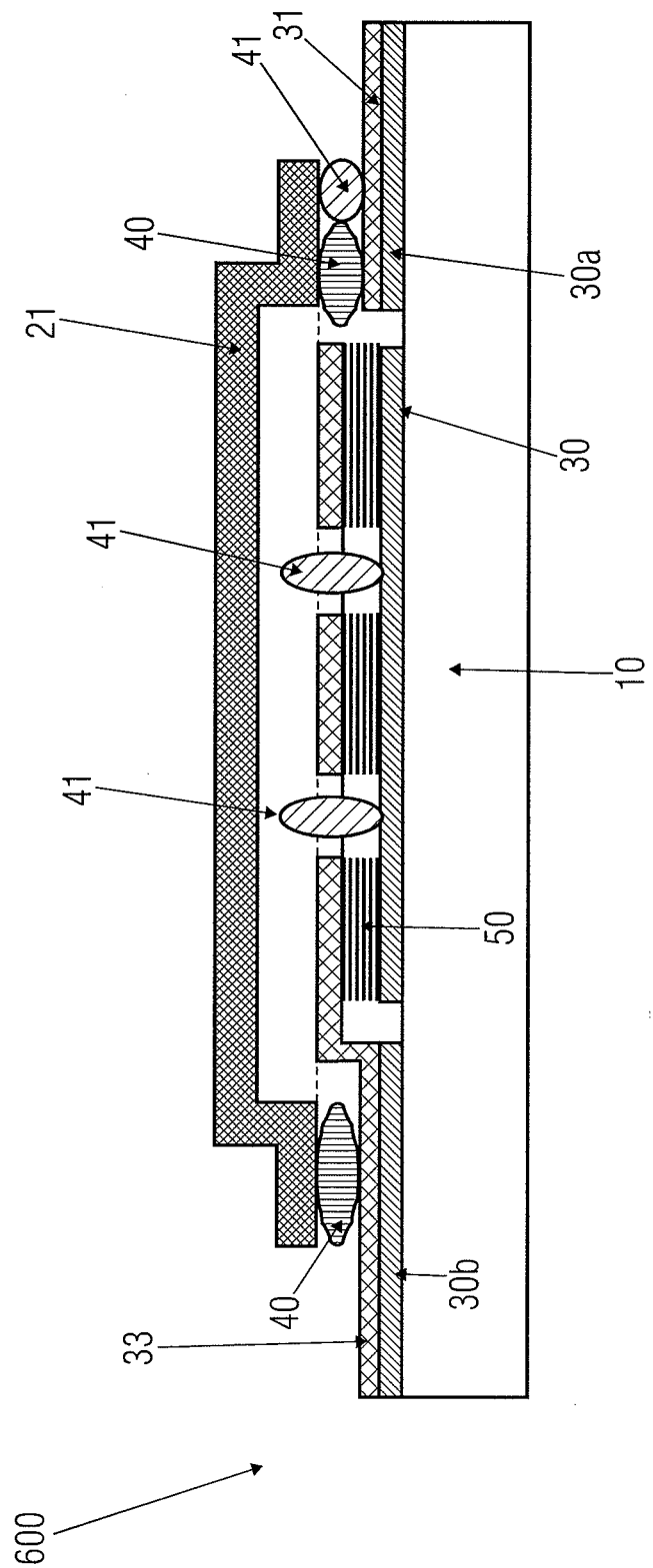
FIG. 6 shows a sectional view of an organic photoelectric device in accordance with a sixth embodiment of the present invention.

FIG. 6 shows a sectional view of an organic photoelectric device 600 in accordance with a sixth embodiment of the present invention. The organic photoelectric device 600 shown in FIG. 6 differs from the organic photoelectric device 200 shown in FIG. 2 by utilization of a cover plate 21 made of sheet metal, instead of a cover glass, as the self-supporting cover member. Due to said utilization of an electrically conductive cover plate 21, an electrically conductive coating 34 of the self-supporting cover member is unnecessary. In this case, too, the cover plate 21 made of sheet metal is connected to the anode terminal of the substrate metallization 31 by means of an electrically conductive adhesive 41 in addition to the encapsulation adhesive 40. Using conducting adhesive 41, the current is carried from the cover plate 21 onto the transparent base electrode 30. For this purpose, electrically insulated through-connection points are provided within the roof electrode 33 and within the organic functional layer 50, i.e. within the functional layer stack of the organic photoelectric device 600. Utilization of an electrically conducting cover plate 21 enables introducing the current only on one side or corner of the organic photoelectric device 600. The electrically conducting cover plate 21 ensures efficient distribution of the current across the entire surface area. In addition, the roof electrode 33 is directly connected, in an electrically conductive manner, to the second partial base electrode 30b, i.e. without any additional substrate metallization 32, and therefore forms the anode terminal.

Figure 7:
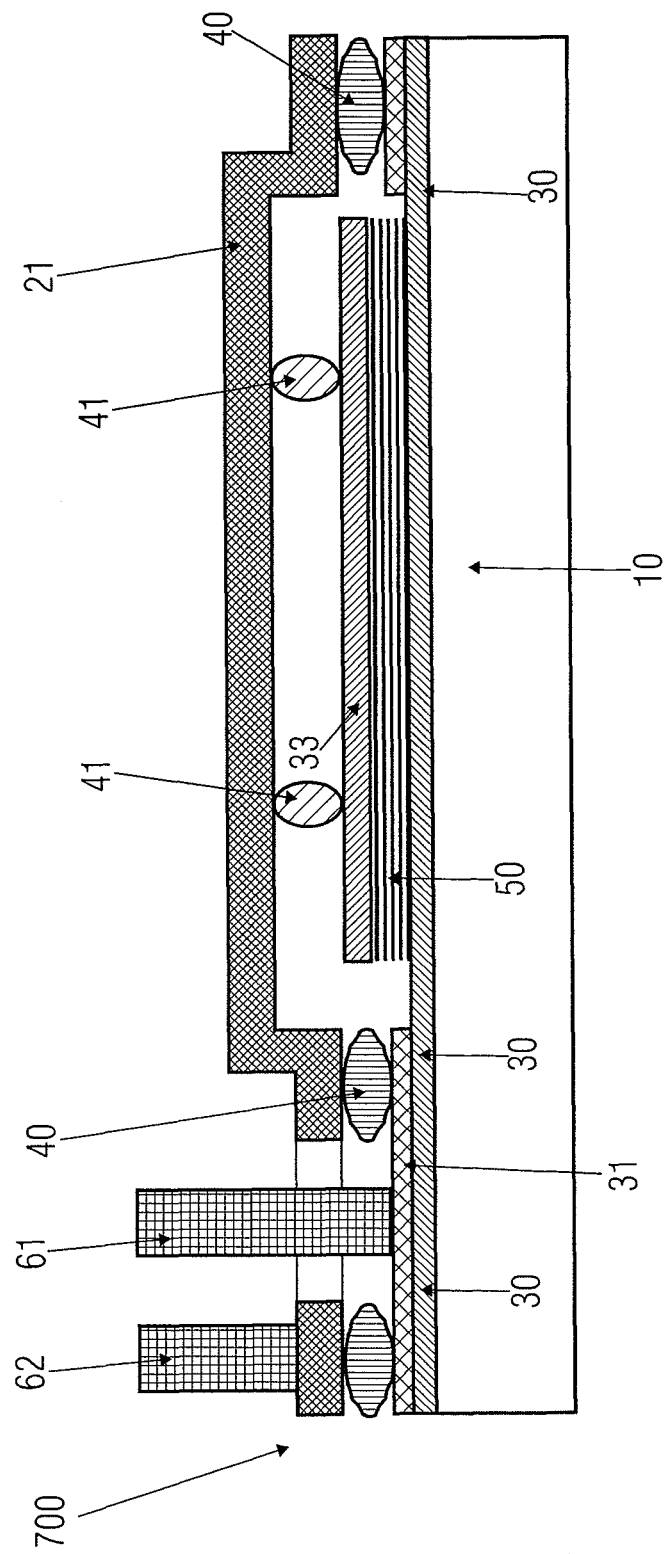
FIG. 7 shows a sectional view of an organic photoelectric device in accordance with a seventh embodiment of the present invention.
Figure 12:
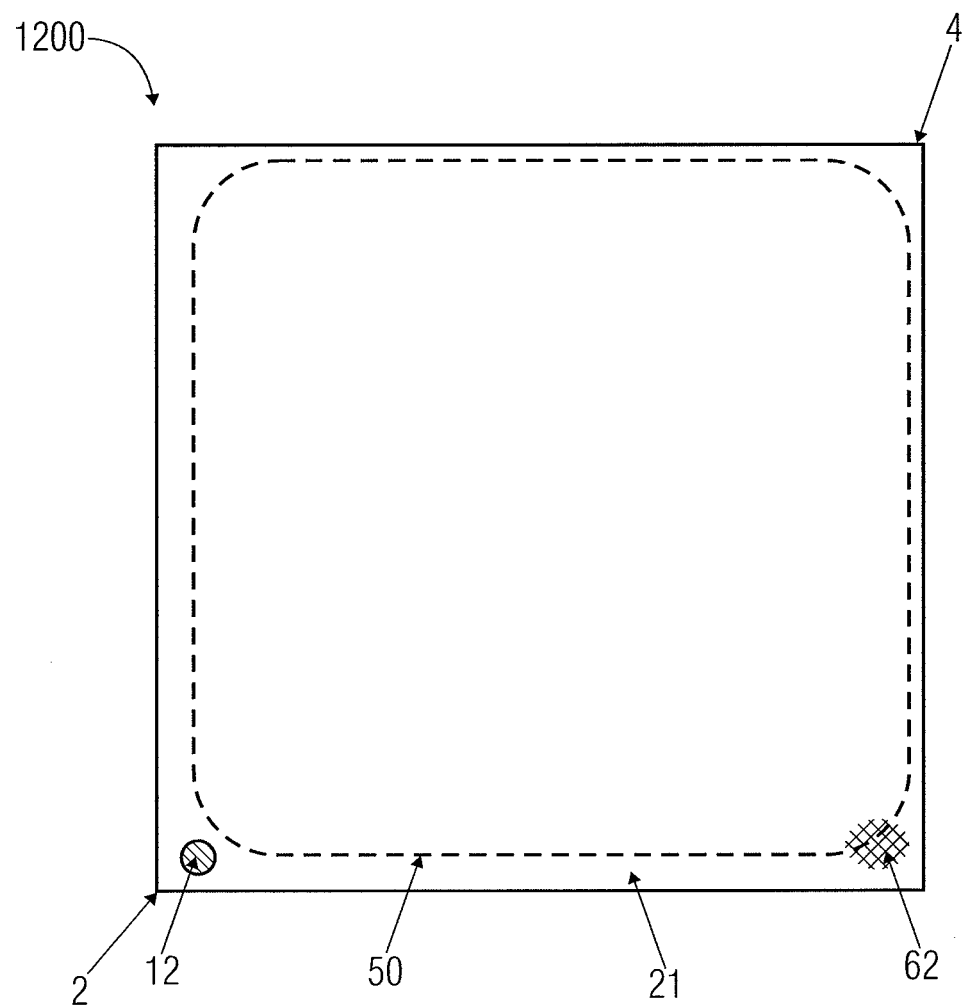
FIG. 12 shows a rear view of an organic photoelectric device in accordance with a twelfth embodiment of the present invention.

FIG. 7 shows a sectional view of an organic photoelectric device 700 in accordance with a seventh embodiment of the present invention. As in the organic photoelectric device 500 shown in FIG. 5, in the organic photoelectric device 700 shown in FIG. 7, too, a cover plate 21 made of sheet metal is used as the self-supporting cover member. The cover plate 21 is connected to a cathode terminal in an electrically conductive manner. Unlike the examples of action shown so far, the cathode is connected directly onto the cover plate 21 by means of an electrically conductive contact pin 62, for example, which is formed on a surface of the cover place 21 that faces away from the substrate 10. Naturally, the cathode may also be directly connected onto the electrically conductive cover plate 21, for example by means of soldering in any desired location of the cover plate 21. That is, unlike the embodiments shown so far, the cathode is not connected via a substrate metallization. As was already the case in the first, third and fifth embodiments, the cover plate 21 drains the current off onto the roof electrode 33 via conductive adhesive 41. However, the anode is contacted via a contact pin 61 through a recess or bore within the cover plate 21 on the substrate metallization 31, said substrate metallization 31 being formed on the base electrode 30. Said recess/bore is surrounded by a ring of encapsulation adhesive 40 in a useful manner so as to protect the organic functional layer 50 from environmental influences. An application exemplary of this is shown by FIG. 12. Here, the non-emitting, or non-absorbing, rear side of an organic photoelectric device in accordance with an embodiment of the present invention is shown. The recess 12 in the form of a bore, which represents the contacting point of the anode metallization 31, is realized only on a corner 2 of the element herein. However, contacting of the cathode 62 may be effected in any other location of the cover plate 21. Usefully, anode contacting may be realized on two opposite corners 2 and 4, since the contact pin 61 may be used as an adjusting element at the same time, in particular when several OLED/OPVC elements, or organic photoelectric devices, are to be lined up. It is also feasible for the recesses 12 for contacting the anode metallization 31 to be provided on all corners. In further embodiments, recesses 12 may exist on all corners; only some of the recesses 12 enable contacting of the anode metallization 31, whereas the remaining ones only serve to adjust the organic photoelectric devices.

Since the contact pin 61 serves to adjust the apparatus on the undersurface, the contact pin 61 will inevitably contact the metal encapsulation sheet, or cover plate, 21. For this reason, an electric insulation is to be provided between the contact pin 61 and the cover plate 21, or the metal sheet. This may be effected, for example, via a non-conducting ring mounted within the recess 12 or around the contact pin 61 and fitting exactly into the recess 12 of the metal encapsulation sheet, or cover plate, 21. The ring may consist of encapsulation adhesive 40, for example.

Similarly, it is also possible for the contact pin 61 to consist of an electrically conducting core, which contacts the contact pad of the substrate metallization 31, and of an insulating sheathing, which contacts the edge of the recess 12 within the metal encapsulation sheet, or cover plate, 21.

The improved mechanical stability provided by the metal cover plate is further improved by utilization of said contact pins 61, since in this manner, simple electric contacting as well as mechanical attachment is additionally enabled.

Even though in the organic photoelectric device shown in FIG. 12 the contact pin 61 is formed as an anode contact-making point for contacting the base electrode 30, and even though the cover plate 21 is connected to a cathode for contacting the roof electrode 33, it is also possible, in a further embodiment, for a contact pin 62 to be configured as cathode contact-making points for contacting the roof electrode 33, and for the cover plate 21 to be connected to an anode for contacting the base electrode 30.

Figure 8:
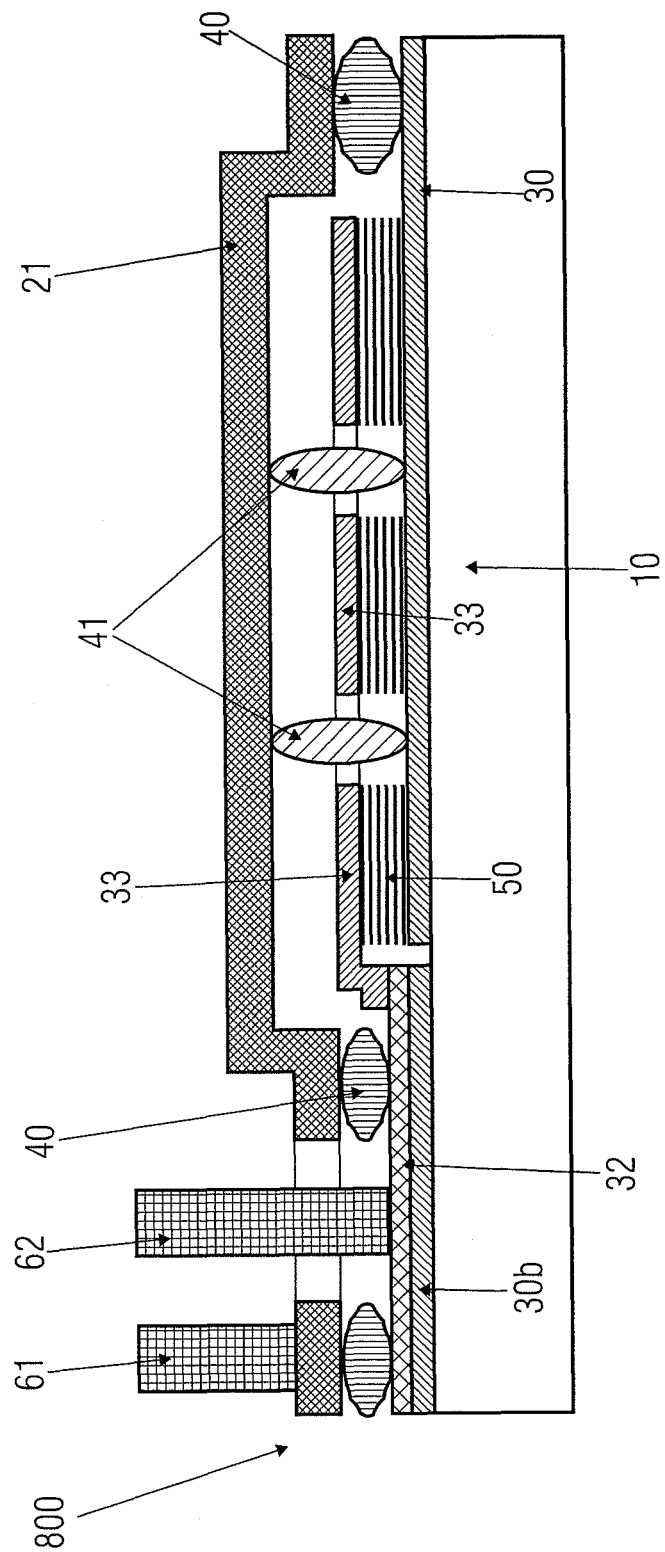
FIG. 8 shows a sectional view of an organic photoelectric device in accordance with an eighth embodiment of the present invention.

FIG. 8 shows a sectional view of an organic photoelectric device 800 in accordance with an eighth embodiment of the present invention. Just like in the organic photoelectric device 600 shown in FIG. 6, the self-supporting cover member in the organic photoelectric device 800 shown in FIG. 8 is configured as a cover plate 21 made of sheet metal. The organic photoelectric device 800 shown in FIG. 8 differs from the photoelectric device 600 shown in FIG. 6 in that the anode is connected directly onto the cover plate 21, for example by means of a contact pin 61, rather than via a substrate metallization. As in the organic photoelectric device 600 shown in FIG. 6, the cover plate 21 carries the current directly onto the transparent base electrode 30 via electrically conductive adhesive 41, for which purpose electrically insulated through-connection points are provided within the functional layer stack, or within the roof electrode 33 and the organic functional layer 50 of the OLED/OPVC, or the organic photoelectric device 800. In addition, in contrast to the organic photoelectric device 600 shown in FIG. 6, the cathode is contacted via a contact pin 62, comparable to the contact pin 61 of FIG. 7, through a recess, or bore, within the cover plate 21 on the substrate metallization 32. As was already shown in the second, fourth embodiments, the substrate metallization 32 is directly connected to the roof electrode 33, and a partial base electrode 30b is formed on a surface facing away from the substrate 10. The recess or bore for pushing through the contact pin 62 in the cover plate 21 may be realized in one or more corners of the cover plate 21, and is surrounded, advantageously between the substrate 10 and the cover plate 21, by a ring of encapsulation adhesive 40.

Figure 9:
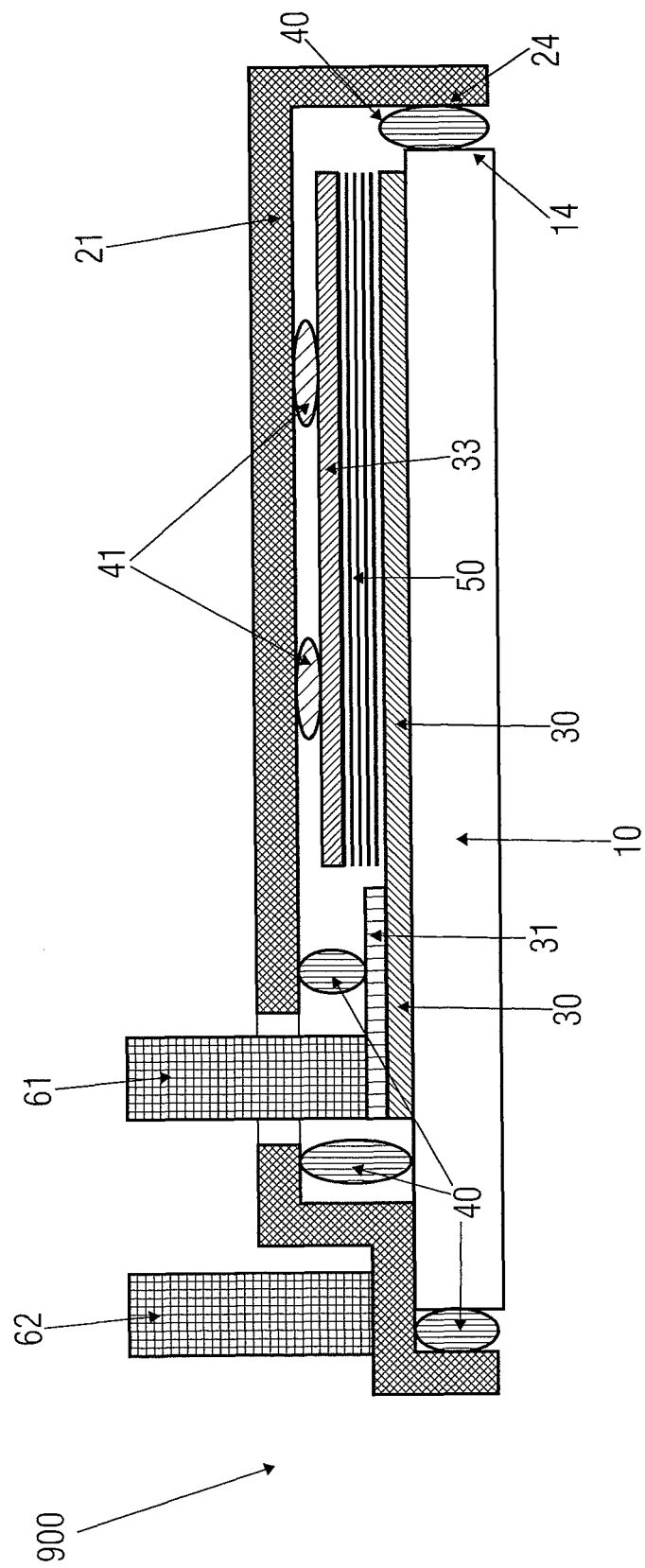
FIG. 9 shows a sectional view of an organic photoelectric device in accordance with a ninth embodiment of the present invention.

FIG. 9 shows a sectional view of an organic photoelectric device 900 in accordance with a ninth embodiment of the present invention. The organic photoelectric device 900 shown in FIG. 9 differs from the organic photoelectric device 700 shown in FIG. 7 in that the cover plate 21 made of sheet metal has a collar 24 on its edges, which was produced by deep drawing, for example. As a result, the cover plate 21 forms a trough into which the coated OLED/OPVC substrate 10 is inserted, and to which it is adhered. The collar 24 of the cover plate 21 serves as an encapsulation area which has the encapsulation adhesive 40 applied thereto so as to protect the organic functional layer from environmental influences. In other words, the encapsulation adhesive is applied between the collar 24 of the cover plate 21 and front ends 14 of the substrate 10, and thus seals off the space enclosed by the cover plate 21 from environmental influences. As a result, the area on the substrate surface 11 that is useful for encapsulation is largely dispensed with, whereby the inactive edge region of the organic photoelectric device 900 is minimized further. Contacting of the cathode, for example by means of a contact pin 62, is effected—by analogy with the seventh embodiment—directly via the cover plate 21, the current being directed onto the roof electrode 33 via conductive adhesive 41. The anode, however, is contacted, by analogy with the seventh embodiment, via a contact pin 61 through a recess or bore within the cover plate 21 on the substrate metallization 31. The recess or bore for inserting the contact pin 61 may be realized in one or more corners of the cover plate 21, and may be surrounded, advantageously between the substrate 10 and the cover plate 21, by a ring of encapsulation adhesive 40.

Figure 10:
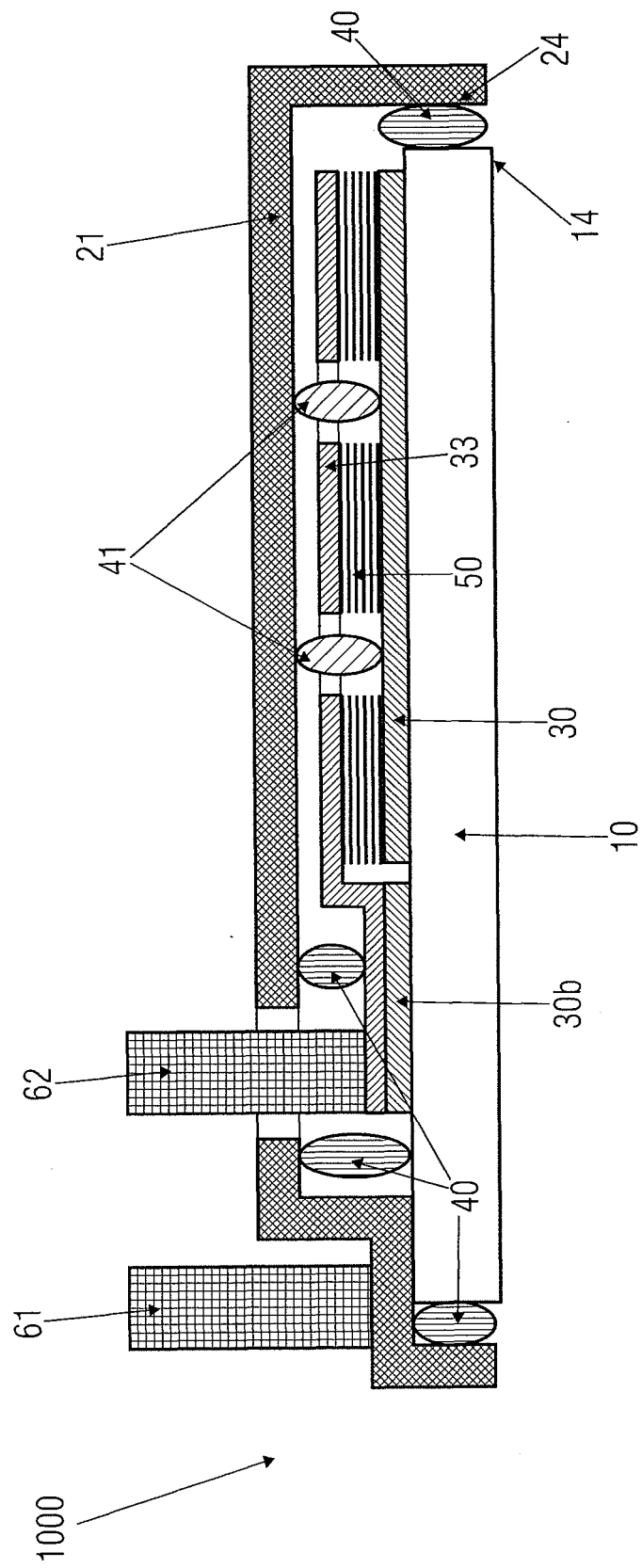
FIG. 10 shows a sectional view of an organic photoelectric device in accordance with a tenth embodiment of the present invention.

FIG. 10 shows a sectional view of an organic photoelectric device 1000 in accordance with a tenth embodiment of the present invention. The organic photoelectric device 1000 shown in FIG. 10 differs from the organic photoelectric device 800 shown in FIG. 8 in that the roof electrode 33 is directly connected to the second partial base electrode 30b, as in the organic photoelectric device 600 shown in FIG. 6, i.e. it is connected in an electrically conductive manner without any additional substrate metallization 32, and additionally, above all, in that the cover plate 21 in that the cover plate 21 made of sheet metal has a collar 24 on its edges, which was produced by deep drawing, for example. As a result, the cover plate 21 forms a trough into which the coated OLED/OPVC substrate 10 is inserted, and to which it is adhered. The collar 24 of the cover plate 21 serves as an encapsulation area which has the encapsulation adhesive 40 applied thereto. In other words, the encapsulation adhesive is applied between the collar 24 of the cover plate 21 and front ends 14 of the substrate 10, and thus seals off the space enclosed by the cover plate 21 from environmental influences. As a result, the area on the substrate surface 11 that is useful for encapsulation is largely dispensed with, whereby the inactive edge region of the organic photoelectric device 1000 is minimized further. Contacting of the anode, for example by means of a contact pin 61, is effected—by analogy with the eighth embodiment—directly via the cover plate 21, the current being carried directly onto the transparent base electrode 30 via conductive adhesive 41, for which purpose electrically insulated through-connection points are provided within the functional layer stack, or within the roof electrode 33 and the organic functional layer 50 of the OLED/OPVC, or the organic photoelectric device 1000. The cathode, however, is contacted, by analogy with the eighth embodiment, via a contact pin 62 through a recess or bore within the cover plate on the substrate metallization 32. The recess or bore for inserting the contact pin 61 may be realized in one or more corners of the cover plate 21, and may be surrounded, advantageously between the substrate 10 and the cover plate 21, by a ring of encapsulation adhesive 40.

Figure 11:
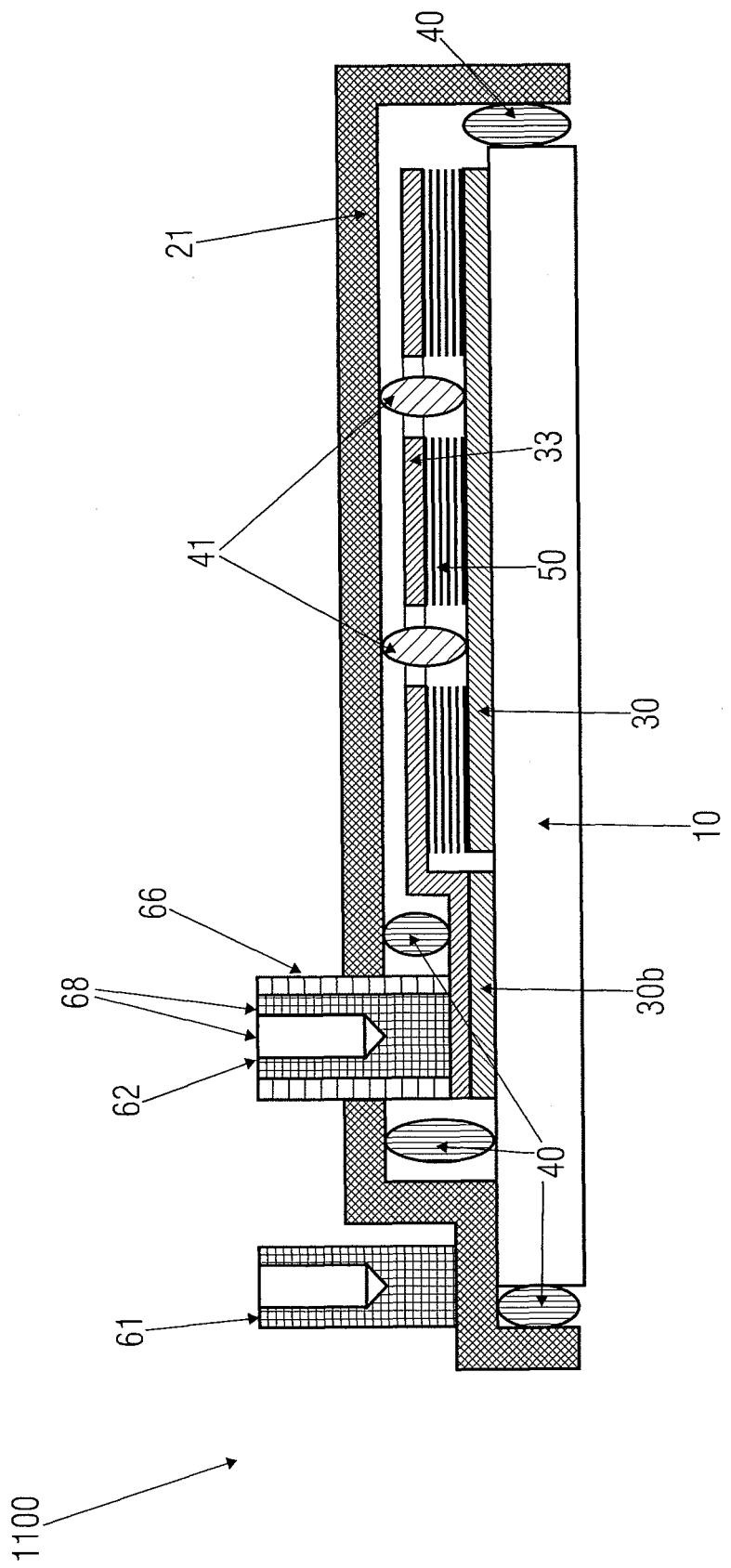
FIG. 11 shows a sectional view of an organic photoelectric device in accordance with an eleventh embodiment of the present invention.

FIG. 11 shows a sectional view of an organic photoelectric device 1100 in accordance with an eleventh embodiment of the present invention. On the basis of the organic photoelectric device 1000 shown in FIG. 10, the organic photoelectric device 1100 shown in FIG. 11 comprises contact pins 61, 62 that are fixedly connected to the cover plate 21. This may be realized in that the contact pins 61, 62 are pressed in or glued, for example. The contact pins 61, 62, or pins, have an electrically conductive core 64 made of metal, for example, and an electrically insulating sheathing 66. The conductive core 64 is connected, e.g. by means of a conductive adhesive, to the contact pads on the OLED/OPVC substrate 10, i.e. the conductive core 64 of at least one first contact pin 61, 62 is connected to the cover plate 21, which is coupled to the base electrode 30 or to the roof electrode 33 in an electrically conductive manner, and a conductive core 64 of at least a second contact pin 61, 62 is connected to a substrate metallization 31, 32 which is coupled to the roof electrode 33 or to the base electrode 30 in an electrically conductive manner, the electrically insulating sheathing 66 of the second contact pin 61, 62 contacting the cover plate. In addition, an internal thread 68 may be implemented, for example, within the electrically conductive core 64, on the outside, i.e. on that side which faces away from the substrate 10, which enables simple assembly of the apparatus, or of the organic photoelectric device 1100. Moreover, the electrically conductive core 64 may also be configured as a permanent magnet in that it consists of a magnetized material.

Even though in the embodiments shown, the organic photoelectric devices are formed as substrate emitters, it is also feasible for the conductive coating of the self-supporting cover member and for the self-supporting cover member to be transparent to the useful wavelength of organic photoelectric devices, and for embodiments to be configured as substrate absorbers.

In addition, in a further embodiment of the present invention, the electrically conductive material may be coupled to the roof electrode in an electrically conductive manner, and the self-supporting cover member may comprise a further electrically conductive material electrically insulated from the roof electrode and from that material that is coupled to the roof electrode in an electrically conductive manner. The further electrically conductive material may be coupled to the base electrode in an electrically conductive manner, for example via through-connections insulated from the roof electrode and from the organic functional layer. In the case of the conductive self-supporting cover member, the conductive self-supporting cover member may comprise, for example, two electrically conductive materials separated by electric insulation layers. In case the self-supporting cover member is coated, the self-supporting cover member may locally comprise, at laterally distributed locations, conductive materials that are electrically insulated from one another, it being advantageous for those locations to be electrically coupled to each other which couple the same electrode in an electrically conductive manner. For example, a strip arrangement of the two electrically conductive materials is feasible. Because of an electrically conductive coupling of the roof electrode and of the base electrode to conductive material of the self-supporting cover member, complete omission of metal meshes for reducing the sheet resistance of the base electrode and/or the roof electrode is made possible, which results in simplified production and improved utilization of the optically active area.

A further embodiment of the present invention may be configured as an organic light emitting diode or an organic solar cell consisting of substrates, a base electrode, organic layers, a roof electrode, and encapsulation, wherein an encapsulation glass is provided with metallic conductor lines and is adhered onto the OLED/OPVC substrate. The metal conductor lines on this encapsulation glass are connected, for example, by means of an electrically conductive adhesive, both to the roof electrode of the OLED/OPVC and to the edge contact pads on the substrate, and the enclosure glass is provided with an etched or milled cavity.

A further embodiment of the present invention may be configured as an organic light emitting diode or an organic solar cell consisting of substrates, a base electrode, organic layers, a roof electrode, and encapsulation, wherein an encapsulation glass is provided with metallic conductor lines and is adhered onto the OLED/OPVC substrate. The metal conductor lines on this encapsulation glass are connected, for example, by means of an electrically conductive adhesive, both to the base electrode of the OLED/OPVC via a through-connection electrically insulated from the roof electrode and to the edge contact pads on the substrate. The enclosure glass here is provided with an etched or milled cavity.

A further embodiment of the present invention may be configured as an organic light emitting diode or an organic solar cell consisting of substrates, a base electrode, organic layers, a roof electrode, and encapsulation, wherein an encapsulation glass is provided with metallic conductor lines and is adhered onto the OLED/OPVC substrate. The metal conductor lines on this encapsulation glass are connected, for example, by means of an electrically conductive adhesive, both to the roof electrode of the OLED/OPVC and to the edge contact pads on the substrate, and the enclosure glass is provided with a rushed or milled cavity. The enclosure glass consists of a planar substrate. The cavity, a flat depression of the encapsulation glass, is created by a glass frit frame, which is applied with the substrate, prior to encapsulation, by means of a suitable printing process at the contact pads to be provided with encapsulation adhesive, and is burnt in.

A further embodiment of the present invention may be configured as an organic light emitting diode or an organic solar cell consisting of substrates, a base electrode, organic layers, a roof electrode, and encapsulation, wherein an encapsulation glass is provided with metallic conductor lines and is adhered onto the OLED/OPVC substrate. The metal conductor lines on this encapsulation glass are connected, for example, by means of an electrically conductive adhesive, both to the base electrode of the OLED/OPVC via a through-connection electrically insulated from the roof electrode and to the edge contact pads on the substrate. The enclosure glass consists of a planar substrate. The cavity, a flat depression of the encapsulation glass, is created by a glass frit frame, which is applied with the substrate, prior to encapsulation, by means of a suitable printing process at the contact pads to be provided with encapsulation adhesive, and is burnt in.

A further embodiment of the present invention may be configured as an OLED/OPVC emitting and/or absorbing through the substrate, consisting of substrates, a transparent base electrode, organic layers, a roof electrode, and encapsulation, wherein an encapsulation element of metal is adhered onto the OLED/OPVC substrate and serves for electrical contacting both with the roof electrode of the OLED/OPVC and with an external power supply and/or control electronics.

Embodiments of the present invention, wherein an encapsulation element is made of metal, may have, on the corners, recesses and bores enclosed by encapsulation adhesive, and may enable contacting, which is electrically insulated from the encapsulation element, of the base electrode of the OLED/OPVC with an external power supply and/or control electronics.

A further embodiment of the present invention may be configured as an OLED/OPVC emitting/absorbing through the substrate, consisting of substrates, a transparent base electrode, organic layers, a roof electrode, and encapsulation, wherein an encapsulation element of metal is adhered onto the OLED/OPVC substrate and serves for electrical contacting both with the base electrode of the OLED/OPVC via a through-connection electrically insulated from the roof electrode, and with an external power supply and/or control electronics.

Embodiments of the present invention, wherein an encapsulation element is made of metal, may have, on the corners, recesses and bores enclosed by encapsulation adhesive, and may enable contacting, which is electrically insulated from the encapsulation element, of the roof electrode of the OLED/OPVC with an external power supply and/or control electronics.

In embodiments of the present invention, wherein the encapsulation element made of metal is larger than the OLED/OPVC glass substrate, the encapsulation element may serve to mechanically attach the OLED/OPVC element.

In further embodiments of the present invention, the encapsulation element may be in the form of a trough made of a metal sheet which has been deep-drawn, for example, within which trough the substrate is placed, and may be adhered to the substrate at least at the lateral front ends of the substrate.

In further embodiments of the present invention, the encapsulation element may be made of magnetic sheet metal, which may be used for mechanically fixing the OLED/OPVC element.

In further embodiments of the present invention, the encapsulation element may be bent and consist of a magnetic metal sheet, whereby a bent OLED/OPVC element, or organic photoelectric device, may be produced in connection with the use of flexible substrates, such as transparent films or thin glass as the OLED/OPVC substrate, so that the OLED/OPVC may be installed into an application apparatus via the encapsulation element.

In further embodiments of the present invention, the encapsulation element may be configured as an encapsulation glass, the encapsulation glass ideally having a size identical with that of the substrate, and comprising, on the corners, holes that enable contacting of the contact pads on the substrate.

In further embodiments of the present invention, the contacting bore or contacting holes of the encapsulation element may have a contact pin introduced into them which enables simple contacting of the apparatus, or of the electrode terminals, and consists of an electrically conductive material. The contact pin introduced into the contacting bore or contacting holes of the encapsulation element may comprise, for example, an electrically conductive core and an insulating sheathing; in addition, the contact pin may be configured as a permanent magnet and comprise an internal thread, for example.

In further embodiments of the present invention, complete omission of cavities is possible when, for example, the functional layers of the OLED/OPVC, or the organic functional layer 50, are provided with encapsulation adhesive 40 across their entire surfaces. Thus, simple metallization of the cover glass 21 is also possible.

In other words, one may state that in further embodiments of the present invention, the cover glass is provided, similarly to the substrate, with a metallization—the cover glass metallization. This has the purpose of carrying the current, which has been introduced onto the metallization of the cover glass, to the cover glass by means of an electrically conducting adhesive. The cover glass metallization carries the current to further points of contact, which may be located at the other positions of the edge region or may be distributed across the entire surface area of the cover glass, and which, in turn, carry the current onto the roof electrode or the base electrode, by means of electrically conductive adhesive. Thus, uniform current distribution across the entire surface area may be enabled.

In further embodiments, a cover element, for example an encapsulation sheet made of metal or any other conducting material, may be employed instead of the cover glass metallization.

This has the advantage that the non-luminous edge region may be minimized further in that this encapsulation metal sheet has, on its edge, a collar which encloses the substrate front ends, or front ends of the substrate. Encapsulation is then performed on the substrate front ends in addition to the edge region of the coating side of the substrate. To make up for this, the width of the adhesion region on the coated side, i.e. on a non-front end of the substrate, may be reduced while maintaining the stability of the "adhesion seam".

In such an apparatus, the metallic encapsulation element serves as a contact element for the cathode or the anode, depending on the implementation of the apparatus or organic photoelectric device.

For contacting the respectively other electrode, the encapsulation metal sheet comprises bores/holes, advantageously on the corners. Contacting of the substrate may be realized via said holes via a contact pin. The contact pin may either be fixedly connected to the substrate/encapsulation element or be introduced from outside.

If the contact pin is fixedly integrated into the OLED/OPVC, said contact pin is advantageously magnetic or has a bore comprising an internal thread. Thus, mechanical attachment of the apparatus may be ensured at the same time as electrical contacting.

If a magnetic contact pin is used, said contact pin is advantageously designed to be conical, so that placement of an OLED/OPVC apparatus in a fixture provided with bores that have a chamfer corresponding to the conical pin enables self-positioning of the apparatus.

Thus, in addition to electrical contacting and mechanical attachment, the pin also ensures exact positioning within a fixture, which is important in particular when lining up several OLED/OPVC apparatuses.

When using a contact pin with a metallic encapsulation element, electrical insulation of the contact pin and the encapsulation element may be ensured, which may be realized, for example, by adhesion of, or a plastic sheathing of, the contact pin.

Embodiments of the present invention thus enable reduction of non-luminous or optically inactive regions of an organic photoelectric device, or OLED/OPVC, in that edge areas of the individual OLED or OPVC elements are minimized by combining contact and encapsulation areas, which, therefore, enables producing large light emitting areas, or optically active areas, having a high filling level. The encapsulation depicted in the embodiments shown, comprising alternative or patterned encapsulation substrates, enables large-area OLED/OPVC elements with minimum inactive edge regions that are useful for encapsulation and contacting.

This is enabled by the production of large-format OLED light emission elements and organic solar cells (OPVC) having small inactive edge regions and, thus, an improved optical impression when several OLED elements are lined up, and improved area utilization when several OPVC elements are lined up, due to small and, thus, less visible inactive regions between the individual elements. In addition, embodiments of the invention enable omission of cover glasses comprising cavities that are costly to produce, which embodiments are therefore less expensive to produce in larger quantities, and may therefore be produced in a more environmentally-friendly manner overall. In addition, embodiments of the present invention are characterized by a simple contacting of the OLED/OPVC elements and simpler attachment/assembly and handling of the OLED/OPVC elements due to increased mechanical stability of the apparatus. This generally leads to increased robustness of the OLED/OPVC elements.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An organic photoelectric device, comprising:
a substrate;
a base electrode formed on a first surface of the substrate;
a first electrode terminal accessible from above the first surface of the substrate;
a roof electrode;
an organic functional layer arranged between the base electrode and the roof electrode;
a self-supporting cover member for encapsulating the organic functional layer between the substrate and the self-supporting cover member, the self-supporting cover member being formed of a conductive material or being coated with a conductive material on a side facing the substrate;
the conductive material being locally coupled, in a conductive manner, to the base electrode or to the roof electrode at laterally distributed locations; and
the conductive material being coupled to the first electrode terminal in an electrically conductive manner.

2. The organic photoelectric device as claimed in claim 1, further comprising a second electrode terminal, the second electrode terminal being coupled, in an electrically conductive manner, to that of the base electrode or the roof electrode which is not coupled to the conductive material in an electrically conductive manner; and
the second electrode terminal being arranged on the first surface of the substrate and laterally projecting above a region encapsulated by the cover member.

3. The organic photoelectric device as claimed in claim 1, configured to emit or absorb light through the substrate.

4. The organic photoelectric device as claimed in claim 1, wherein the conductive material is coupled, in an electrically conductive manner, to the base electrode or the roof electrode by means of portions of electrically conductive adhesive that are arranged at the laterally distributed locations on a surface of the base electrode or of the roof electrode, said surface facing away from the substrate.

5. The organic photoelectric device as claimed in claim 1, wherein the self-supporting cover member comprises a glass plate comprising a cavity for receiving the organic functional layer.

6. The organic photoelectric device as claimed in claim 1, wherein the self-supporting cover member comprises a glass plate, a frame being arranged, on a side of the glass plate that faces the substrate, between the first surface of the substrate and the glass plate, so that the organic functional layer is arranged within a cavity limited by the substrate, the glass plate and the frame.

7. The organic photoelectric device as claimed in claim 1, wherein the self-supporting cover member is a metal lock cover.

8. The organic photoelectric device as claimed in claim 7, wherein the metal lock cover comprises a border attached on side surfaces of the substrate.

9. The organic photoelectric device as claimed in claim 1, further comprising:
   through-connections that are electrically insulated from the cover electrode and from the organic functional layer and are locally arranged at the laterally distributed places via which the conductive material is coupled to the base electrode in an electrically conductive manner.

10. The organic photoelectric device as claimed in claim 1, comprising:
    a second electrode terminal, the second electrode terminal being coupled, in an electrically conductive manner, to that of the base electrode or the roof electrode which is not coupled to the conductive material in an electrically conductive manner.

11. The organic photoelectric device as claimed in claim 7, comprising:
    a second electrode terminal, the second electrode terminal being configured as an electrically conductive contact pin insulated from the metal lock cover; and
    the metal lock cover comprising a bore through which the electrically conductive contact pin extends to couple the electrically conductive contact pin to that of the base electrode or the roof electrode which is not coupled to the conductive material in an electrically conductive manner.

12. The organic photoelectric device as claimed in claim 11, wherein the contact pin is configured as a permanent magnet.

13. The organic photoelectric device as claimed in claim 10, wherein the contact pin comprises an internal thread and/or an electrically conductive core and/or an electrically non-conductive sheathing.

14. The organic photoelectric device as claimed in claim 1, wherein the organic photoelectric device is configured as an organic light emitting diode (OLED) emitting through the substrate, or as an organic photovoltaic cell (OPVC) absorbing through the substrate.

15. The organic photoelectric device as claimed in claim 1, wherein the conductive material is conductively coupled to the roof electrode, and the self-supporting cover member further comprises a further conductive material which is electrically insulated from the conductive material that is locally coupled, in an electrically conductive manner, to the roof electrode at laterally distributed locations, is locally coupled, in an electrically conductive manner, to the base electrode at further laterally distributed locations via through-connections electrically insulated from the roof electrode and from the organic functional layer, and is coupled to a further electrode terminal in an electrically conductive manner.

* * * * *